US006940378B2

(12) United States Patent
Miller et al.

(10) Patent No.: US 6,940,378 B2
(45) Date of Patent: Sep. 6, 2005

(54) APPARATUS AND METHOD FOR MAGNETIC RESONANCE MEASUREMENTS IN AN INTERIOR VOLUME

(75) Inventors: Melvin N. Miller, Wynnewood, PA (US); Manfred G. Prammer, Downingtown, PA (US); Moti Huber, Houston, TX (US); Sergei Knizhnik, Exton, PA (US)

(73) Assignee: Halliburton Energy Services, Houston, TX (US)

( * ) Notice: Subject to any disclaimer, the term of this patent is extended or adjusted under 35 U.S.C. 154(b) by 0 days.

(21) Appl. No.: 09/766,044

(22) Filed: Jan. 19, 2001

(65) Prior Publication Data

US 2002/0097051 A1 Jul. 25, 2002

(51) Int. Cl.[7] ................................................ H01F 1/00
(52) U.S. Cl. ...................................... 335/296; 335/216
(58) Field of Search ......................... 335/216, 296–306; 324/318–321

(56) References Cited

U.S. PATENT DOCUMENTS

| | | | | |
|---|---|---|---|---|
| 3,931,760 A | * | 1/1976 | Cheatum | .................... 335/306 |
| 4,350,955 A | | 9/1982 | Jackson et al. | |
| 4,703,276 A | * | 10/1987 | Beer | .......................... 324/319 |
| 4,710,713 A | | 12/1987 | Strikman | |
| 4,714,881 A | | 12/1987 | Givens | |
| 4,727,327 A | * | 2/1988 | Toyoshima et al. | ......... 324/309 |
| 4,825,163 A | | 4/1989 | Yabusaki et al. | |
| 4,829,252 A | | 5/1989 | Kaufman | |
| 4,875,013 A | | 10/1989 | Murakami et al. | |

(Continued)

FOREIGN PATENT DOCUMENTS

EP          0 649 035 B1     4/1995

OTHER PUBLICATIONS

Edwards et al., "Effects of Tool Design and Logging Speed on $T_2$ NMR Log Data," SPWLA 38th Annual Logging Symposium, Jun. 15–18, 1997.

Jackson et al., "Western Gas Sands Project Los Alamos NMR Well Logging Tool Development," Los Alamos National Laboratory (Oct. 1981–Sep. 1982) pp. 1–28.

Jasper A. Jackson, "Nuclear Magnetic Resonance Well Logging," The Log Analyst, Sep.–Oct. 1984, pp. 16–30 (no date).

Kleinberg et al., "Novel NMR Apparatus for Investigating an External Sample," *Journal of Magnetic Resonance*, (1992) pp. 466–485 (no month).

Prammer et al., "Theory and Operation of a New, Multi–Volume, NMR Logging System," SPWLA 40th Annual Logging Symposium, May 30–Jun. 3, 1999.

*Primary Examiner*—Lincoln Donovan
(74) *Attorney, Agent, or Firm*—Jones Day

(57) ABSTRACT

A magnet assembly and a magnetic field configuration are disclosed for the generation of a magnetic field in a defined volume, with the field being homogeneous over a predetermined portion of the volume and not homogeneous over the rest. The disclosed magnetic assembly has a plurality of spaced-apart magnets arranged in pairs. The magnets of each pair are be positioned diametrically opposite each other with respect to an enclosed volume. In different embodiments magnets may all be arranged such that their magnetization directions are substantially aligned, or could alternatively be arranged to have magnetizations pointing in different directions. The angular spacing between the magnets is selected in the range of approximately 13°–17° and could be as large as the size of the magnets. The assembly generates a homogeneous magnetic field within an inner portion of the defined volume, and a second magnetic field, substantially different from the homogeneous magnetic field throughout the remainder, i.e., in the periphery of the defined volume.

37 Claims, 8 Drawing Sheets

U.S. PATENT DOCUMENTS

| | | |
|---|---|---|
| 4,885,540 A | 12/1989 | Snoddy et al. |
| 4,899,112 A | 2/1990 | Clark et al. |
| 4,933,638 A | 6/1990 | Kleinberg et al. |
| 4,949,045 A | 8/1990 | Clark et al. |
| 4,994,777 A | 2/1991 | Leupold et al. |
| 5,023,551 A | 6/1991 | Kleinberg et al. |
| 5,055,787 A | 10/1991 | Kleinberg et al. |
| 5,055,788 A | 10/1991 | Kleinberg et al. |
| 5,148,138 A * | 9/1992 | Miyata ................ 335/302 |
| 5,235,285 A | 8/1993 | Clark et al. |
| 5,359,324 A | 10/1994 | Clark et al. |
| 5,376,884 A | 12/1994 | Sezginer |
| 5,397,989 A | 3/1995 | Spraul et al. |
| 5,432,446 A | 7/1995 | MacInnis et al. |
| 5,453,692 A | 9/1995 | Takahashi et al. |
| 5,486,761 A | 1/1996 | Sezginer |
| 5,486,762 A | 1/1996 | Freedman et al. |
| 5,557,201 A | 9/1996 | Kleinberg et al. |
| 5,629,623 A | 5/1997 | Sezginer et al. |
| 5,767,674 A | 6/1998 | Griffin et al. |
| 5,914,598 A | 6/1999 | Sezginer et al. |
| 5,923,167 A | 7/1999 | Chang et al. |
| 6,008,646 A | 12/1999 | Griffin et al. |
| 6,111,408 A | 8/2000 | Blades et al. |

* cited by examiner

APPARATUS AND METHOD FOR MAGNETIC RESONANCE MEASUREMENTS IN AN INTERIOR VOLUME

FIELD OF THE INVENTION

The present invention relates generally to magnetic resonance methods and devices and in particular to generation of magnetic fields within a defined volume, and making corresponding measurements.

BACKGROUND OF THE INVENTION

Many applications of nuclear magnetic resonance (NMR) analysis of materials or magnetic resonance imaging (MRI) require a uniform, homogeneous magnetic field over a defined analysis volume. In practice, such analysis volume is usually generated within the interior of a device, and is shaped as a cylinder. Devices that provide such uniform homogeneous magnetic fields over a defined interior volume are also known. One such device, which is illustrated in block diagram form in FIG. 1, is described, for example, in Malcolm McGrieg and Alan G. Clegg, "Permanent Magnets in Theory and Practice", Second Edition, John Wiley and Sons, 1987, which is incorporated by reference herein as background material.

As shown in FIG. 1, the magnet assembly 10 is constructed of four (or more) pairs of diagonally opposite magnets arranged symmetrically about a substantially cylindrical volume 11 having a longitudinal axis 12, pointing in a direction perpendicular to the drawing sheet. This arrangement of the magnets is designed to create a substantially homogeneous field in the volume 11 defined by the inner periphery of the magnet assembly. In particular, devices of this type have very small spacing (gaps) between adjacent magnets to ensure that the magnetic field is largely uniform over the entire enclosed volume 11. The presence of larger gaps is known to result in field distortions, and thus is generally avoided.

Homogeneous interior field configuration may be provided by using another type of magnetic structure described in German patent DE 3312626 A1, which is hereby incorporated by reference. FIG. 2 illustrates the magnetic structure proposed in this patent, which consists of a cylindrical magnet 100 surrounded by soft magnetic yoke 110. The cylindrical magnet has diametrical direction of magnetization, indicated in the figure by arrow 120. This structure generates a very homogeneous interior magnetic field throughout the inner cylindrical volume 125. The direction of the interior magnetic field is parallel to the direction of magnetization, as indicated by arrow 130.

Permanent magnet assemblies of the type discussed above have a number of advantages, which include no need for field-generating power, low cost of maintenance, and small installation space. However, a problem with devices of this type is that because the magnetic field they generate is largely uniform and homogeneous over the entire enclosed volume, it is unfeasible to analyze only select portions of the enclosed volume and ignore signals from the rest. An industrial application in which such a feature would be desirable is, for example, NMR analysis on a pre-defined interior portion of a cylindrical core, frequently used in material analysis in the process of drilling rocky formations. Therefore, it is perceived that there is a need for a new apparatus and corresponding measurement method that provide such capability.

SUMMARY OF THE INVENTION

Described herein is a magnet assembly for the generation of a magnetic field in an enclosed volume. More particularly, the magnet assembly used in accordance with the present invention generates a first, substantially homogeneous, magnetic field within an inner portion of an enclosed volume, and a second magnetic field throughout the remainder, i.e., the periphery of the volume, substantially different from the first magnetic field. Analyzed are only signals only within the inner portion of the enclosed volume, where the magnetic field is substantially homogeneous, whereas signals from the remaining portion of the enclosed volume are ignored. Both the dimensions of the inner portion and the parameters of the field in this portion can be adjusted, which provides desirable measurement flexibility.

In one embodiment, the magnet assembly is an annular magnet composed of a plurality of permanent magnet blocks arranged annularly with non-magnetic material used to hold them in place. In particular, the assembly has a plurality of spaced-apart magnets arranged about an outer surface that defines the enclosed volume. Preferably, the magnets are arranged symmetrically about a longitudinal axis of the enclosed volume. Thus, a cross-section of the enclosed volume perpendicular to the axis is symmetrical with respect to the axis. In a specific embodiment, both the enclosed volume and its inner portion are substantially cylindrical. (In this application the term "cylindrical" and "annular" is used broadly and is not limited to the special case of circular shapes.) The size of the inner portion of the enclosed volume can be determined during assembly design by, among others, the dimensions and magnetic properties of the magnets and the gaps between adjacent magnets. Ferromagnetic, diamagnetic, or paramagnetic shims may also be mounted in the gaps between neighboring magnets. In operation, these shims can be moved around in the gaps to provide control over the shape of the magnetic fields and in particular the size of the inner portion.

In accordance with the invention, each of the plurality of magnets is preferably characterized by thickness, magnetic strength and length, which parameters are selected to produce a first magnetic field and a second magnetic field. The first and second magnetic fields are located in different spatial regions of the enclosed volume, and have substantially different profiles. The shape and dimensions of the regions depend upon the configuration of the plurality of magnets. Specifically, the spacing and magnetic properties of the plurality of magnets are selected to produce: (1) a first substantially homogeneous magnetic field within an inner volume coaxial with respect to the enclosed volume, and (2) a second magnetic field, substantially different from the first magnetic field, in the remaining part of the enclosed volume.

In one embodiment, an assembly for generating desired magnetic fields includes at least four pairs of magnets. The magnets of each pair are disposed symmetrically opposite each other with respect to an axis, and have the same magnetization direction. Thus, the magnets of a first pair are oriented with their magnetizations pointing in a first direction, designated for convenience "N." At least a second pair of magnets has a magnetization direction pointing approximately 180° away from "N." At least a third pair of magnets has a magnetization direction pointing approximately 90° away from "N," these magnets providing incremental change in magnetization direction between the first and second pairs. The assembly also has at least a fourth pair of magnets having a magnetization direction pointing approximately 270° away from "N," in a direction opposite to that of the third pair of magnets. The fourth pair of magnets provides a complimentary incremental change in magnetization direction between the first and second pairs. In one embodiment of the assembly, where the cross-sectional diameter of the inner portion is approximately half the diameter of the enclosed volume, spacing between the magnets is in the range of 13°–17°.

In another embodiment, the assembly for generating desired magnetic fields includes a plurality of magnets, all having the same magnetization direction. As in the above-described embodiment, the magnets are disposed annularly with respect to an axis, and the parameters of the magnetic field generated within the enclosed volume are determined by the thickness, magnetic strength, and length of the magnets, along with the gaps between adjacent magnets.

Also disclosed is a method for carrying out nuclear magnetic resonance (NMR) analysis of a defined interior portion of a core sample. One embodiment of the method includes (a) providing a magnetic field surrounding the core volume using a magnet assembly comprising a plurality of magnets arranged in spaced-apart relationship about the core, the spacing and magnetic properties of the plurality of magnets being selected to produce: (1) a first substantially homogeneous magnetic field within the defined interior portion of the core volume, and (2) a second magnetic field, substantially different from the first magnetic field, in the remaining volume of the core, (b) applying radio frequency (RF) energy to the core, and (c) detecting NMR signals from an inner region of the core. NMR signals from outside the inner region of the core are preferably selectively filtered out and/or discarded, thereby providing NMR analysis substantially only of materials located within the inner region.

These and other aspects of the present invention are described in the section Detailed Description of the Preferred Embodiments below.

BRIEF DESCRIPTION OF THE DRAWINGS

The present invention will be understood and appreciated more fully from the following detailed description, taken in conjunction with the drawings in which.

DETAILED DESCRIPTION OF THE PREFERRED EMBODIMENTS

Figure 1:
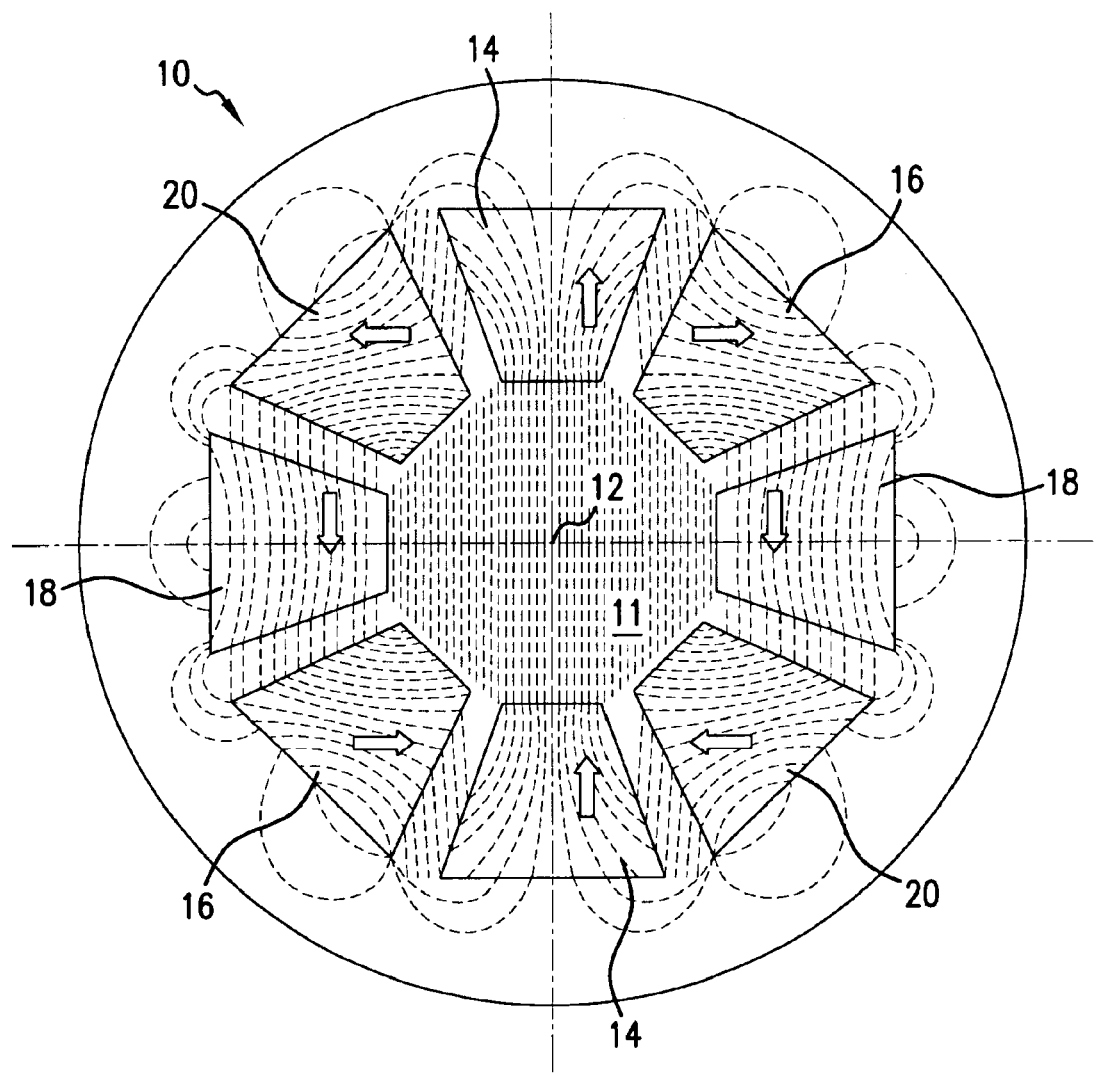
FIG. 1 is a simplified cross-sectional view of a prior art magnet assembly and magnetic field configuration for generating uniform, substantially homogeneous magnetic field within enclosed space.

Reference is now made to FIG. 1, which illustrates a magnet assembly 10 and magnetic field configuration used in the prior art. Specifically, the structure shown in FIG. 1 is that described in Malcolm McGrieg and Alan G. Clegg, "Permanent Magnets in Theory and Practice," Second Edition, John Wiley and Sons, 1987, and illustrated in FIG. 7.61 of the reference. The description of this structure in the McGrieg publication is incorporated herein by reference.

As shown in FIG. 1, eight permanent magnet blocks are arranged annularly to constitute an annular magnet assembly 10. The permanent magnet blocks are of trapezoidal column shape, hence the annular magnet assembly 10 forms a hollow trapezoidal tube or cylinder. In particular, magnet assembly 10 is constructed of four pairs of diagonally opposite magnets arranged symmetrically about the tubular volume 11 having a longitudinal axis 12 (pointing in a direction perpendicular to the drawing sheet) as follows: two magnets 14 have a magnetization direction pointing in one direction, designated "N," two magnets 16 point 90° from "N," two magnets 18 point 180° from "N," and two magnets 20 point 270° from "N." This arrangement of the magnets creates a substantially homogeneous field in the volume 11 defined by the inner periphery of the magnet assembly. It is noted that there is a small, uniform spacing between adjacent magnets. The spacing is typically kept small to ensure that the interior magnetic field is largely uniform over the entire enclosed volume 11.

Notably, the prior art places strong emphasis on achieving such field uniformity within the enclosed region. Factors believed responsible for the non-uniformity of the generated field include the working precision of parts and the assembly precision of the device, along with the non-uniformity of magnetic characteristics found in the permanent magnets. For example, since small magnet bricks are built into the permanent magnet blocks, it is unavoidable with the present fabrication technique of magnet bricks that residual magnetization Br should vary from one magnet brick to another, and that the magnetizing direction should vary with the grinding and bonding processes used in the fabrication of magnet bricks. Therefore, Br and the magnetizing direction inevitably become different within and between permanent magnet blocks, thus easily causing the uniformity of field to be insufficient for use in, for example, MRI. Accordingly, in practical applications of this type sufficient field uniformity cannot be achieved without field regulation after assembly.

In this regard, is should be noted that any deviations from the ideal (i.e., completely homogeneous) configuration of the Halbach structure illustrated in a specific implementation in FIG. 1, has an effect on the outer portion of the interior magnetic field (closer to the magnets), whereas the central part of the interior field remains relatively uniform and is less subjected to the deviations from the ideal configuration. The Halbach magnetic structure is also known in the art as the "magic" cylinder. There are two main configurations of the "classical" Halbach structure: (a) 8 brick-shaped segments of 40° each one, and (b) 8 arch-shaped segments of 36° each one. Changes away from these "optimal" angles result in an appearance of a magnetic field gradient in the interior field. Naturally, this gradient is higher in the vicinity of magnet surfaces and decreases in a direction toward the center of the magnetic system. In the prior art, such changes are considered undesirable, and were avoided using ever more precise materials and assembly techniques.

Figure 2:
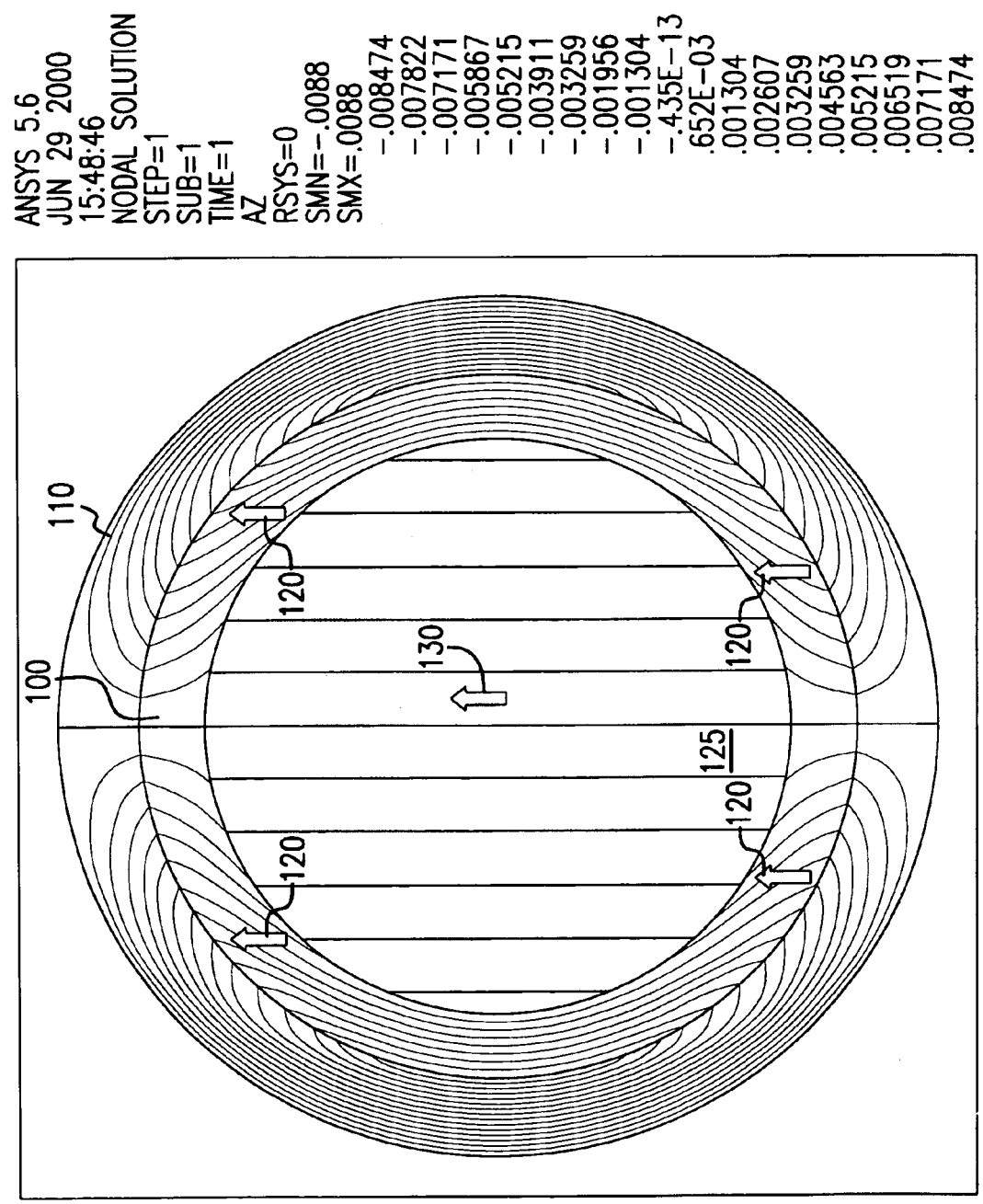
FIG. 2 is a simplified cross-sectional view of a second magnet assembly and magnetic field configuration used in the prior art for generating uniform, substantially homogeneous magnetic field within enclosed space.

In addition to the structure illustrated in FIG. 1, another way to provide similar interior field configuration is provided by another type of prior art magnetic structure described in German patent DE 3312626 A1, which is illustrated in FIG. 2. This magnetic structure consists of a cylindrical magnet 100 surrounded by soft magnetic yoke 110. The cylindrical magnet has direction of magnetization illustrated by arrow 120. This structure generates a very homogeneous interior magnetic field (better than 1 ppm) throughout the inner cylindrical volume 125. As shown, the direction of the interior magnetic field is parallel to the direction of magnetization (arrow 130). The assembly can be used in high-precision laboratory measurements, in research concerning accelerated atomic particles, and other applications requiring high degree of uniformity of the magnetic field.

Prior art magnet assemblies of the type discussed above have a number of advantages, which make them suitable for a range of practical applications. However, a problem with devices of this type is that because the magnetic field they generate is largely uniform and homogeneous over the entire enclosed volume, it is unfeasible to analyze only select portions of the enclosed volume and ignore signals from the rest. An industrial application in which such a feature would be desirable is, for example, NMR analysis on a defined interior portion of a cylindrical core, produced in drilling of rocky formations.

In accordance with the present invention, for such applications a solution is provided by "distorting" the ideal geometry of prior art magnetic assemblies to introduce significant gaps between adjacent magnets. In particular, reference is now made to FIG. 3, which illustrates a magnet assembly 30 and the resulting magnetic field configuration according to one embodiment of the present invention. As shown, in this embodiment magnet assembly 30 is constructed of four pairs of magnets arranged at equal distances along the periphery of a surface 36 having a longitudinal axis 34. In one embodiment, surface 36 is defined by a containment vessel, pipe, or tube. In each pair of magnets, both magnets have substantially the same magnetization direction and are positioned diagonally opposite each other with respect to axis 34. In a preferred embodiment, the outer periphery of surface 36 lies within or adjacent to an inner peripheral surface 38 of the magnets. Two magnets 40 have a magnetization direction pointing in a direction designated for convenience "N," two magnets 42 point 90° from "N," two magnets 44 point 180° from "N," and two magnets 46 point 270° from "N."

Magnet assembly 30 used in the above-described embodiment of the present invention differs from the prior art in that the magnets are purposely spaced further apart from each other to create within a portion of the enclosed volume a magnetic field configuration, which is non-uniform. In a specific embodiment, the angular spacing between the magnets is in the range of approximately 13°–17°, although as discussed below other spacings are possible as well in alternative embodiments. This angular spacing corresponds to gaps between neighboring magnet elements, one effect of which gaps is to allow the magnetic flux that 'flows' between neighboring magnets to extend inwards, into the volume enclosed by the magnet assembly. In accordance with the present invention, the size of the gaps between adjacent magnets (along with the dimensions and properties of the magnets) determines the configuration of the magnetic field within the enclosed volume.

In particular, the arrangement of magnets according to the invention defines a first interior portion or region 50 where the magnetic field 48 is substantially homogeneous, and an external portion or annular region 56, where the magnetic field is non-homogeneous. As shown, the annular region 56 of the second magnetic field 54 extends from the inner periphery 52 to an outer periphery 32. The particular shape and dimensions of regions 50 and 56 depend upon the magnetic properties, dimensions, placement, and orientations of the magnets in assembly 30.

Figure 3:
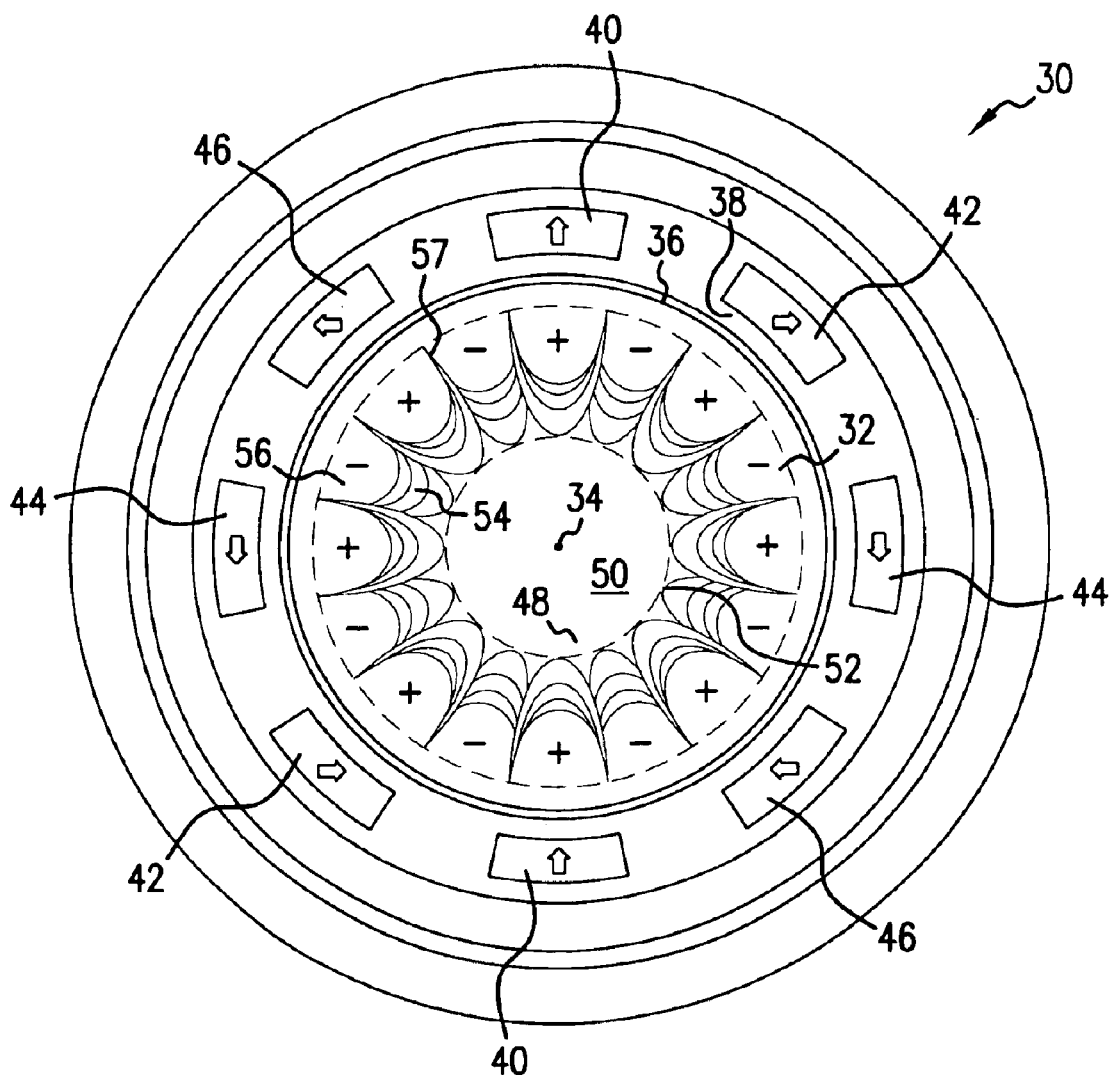
FIG. 3 is a simplified cross-sectional view of one embodiment of a magnet assembly and magnetic field configuration used in accordance with the present invention to generate two separate magnetic field types in an enclosed volume.

In accordance with the present invention, the second magnetic field 54 should be substantially different from the first magnetic field 48, and is preferably heterogeneous. For example, as shown in FIG. 3, second magnetic field 54 may include alternating ("+" and "−") magnetic fields, which are separated by radial "spikes" 57. In a preferred embodiment, the magnetic field in the heterogeneous spikes 57 is of approximately the same strength as the magnetic field in the homogeneous magnetic field 48.

In the illustrated embodiment, the second region 56 of magnetic field is an annulus with radial symmetry, with an outer radius (of outer periphery 32 around the outer region 56) that is twice the inner radius (of inner periphery 52 around the inner region 50). It should of course be appreciated that various relationship between the dimensions of peripheries 32 and 52 may be used to produce desired field geometries. The annular region 56 may have small or large deviations from radial symmetry: in some embodiments magnetic assembly 30 may be configured so that the annular region 56 has a square or octagonal symmetry, for example.

The relative strengths of the first 48 and second 54 magnetic fields are determined by, among other things, the dimensions, arrangement, and magnetic properties of the magnets in the magnet assembly. For example, the strength of homogeneous magnetic field 48 depends on the dimensions of inner and outer regions 50 and 56, as well as the magnetic properties of the magnets.

With reference to FIG. 3, it is noted that orientation of magnets 42 provides an incremental change between the orientations of their neighboring magnets 40 and 44, i.e., one incremental change between magnets 40 and 42 and another change between magnets 42 to 44. Similarly, magnets 46 provide incremental changes in magnetization direction between complimentary magnet elements.

While the embodiment in FIG. 3 is shown using four pairs of magnets, it should be apparent that in alternative embodiments different numbers of magnet pairs can be used. In particular, an assembly having a total of 12 magnets, i.e., 6 diagonally opposite pairs of magnets, spaced substantially evenly about axis 34 can be used. Such a magnet assembly (not shown) includes two opposing pairs of magnets 42A and 42B positioned between magnets 40 and 44 in the upper right and lower left quadrants of magnet assembly 70. Magnets 42A have a magnetization direction pointing +45° from "N," while magnets 42B have a magnetization direction pointing +135° from "N." Magnets 42A and 42B thus provide incremental changes in magnetization direction between the magnets oriented in directions "N" and "N"+180°. Similarly, the magnet assembly in this modified embodiment would include two opposing pairs of magnets 46A and 46B positioned between magnets 44 and 40 in the lower right and upper left quadrants of the magnet assembly. Magnets 46A have a magnetization direction pointing −135° from "N," while magnets 46B have a magnetization direction pointing −45° from "N." Magnets 46A and 46B thus provide incremental changes in magnetization direction between the magnets oriented in directions "N"+180° and "N."

With reference to FIG. 3, it can be appreciated that other magnet assemblies may be constructed with different numbers of opposing pairs of magnets to provide varying degrees of incremental changes in magnetization direction. Preferably, the total number of magnets in 2(n+1), where n is an integer $\geq 1$. In general, the magnets may have any shape or contour, straight or curved. Using a larger number of magnet pairs leads to the presence of more gaps between adjacent magnets, thereby increasing the number of locations at which the flux between neighboring magnets intrudes into the central area.

Further, while in the illustrated embodiments the magnets have been shown positioned along the periphery of a cylinder, so as to define a substantially cylindrical volume of investigation, it can be appreciated that other shapes of the investigated volume are possible. Although various arrangements of the magnet assembly may be used, the spaced-apart position of the magnets creates two separate magnetic field configurations: a homogeneous field in the interior volume, and a substantially different field in the surrounding volume.

As noted above, in a specific embodiment the values of the spacing angles between the magnet segments is in the 13°–17° range. This range is chosen to provide a relatively uniform magnetic field within a diameter that is about half of the magnet assembly's inner diameter. It should be clear, however, that other deviations from the stated above segment angular spacings are possible depending upon required parameters of the uniform interior volume. In particular, in a specific embodiment the gaps between adjacent magnets could be as large as the size of the magnet segments.

In accordance with an alternative embodiment of the present invention, a magnet assembly can be used that corresponds to the structure in FIG. 2. As noted above, FIG. 2 illustrates the magnetic structure which consists of a cylindrical magnet 100 surrounded by soft magnetic yoke 110. The cylindrical magnet has diametrical direction of magnetization. In FIG. 2 the direction of the magnetization is indicated by arrow 120. This structure generates a very homogeneous interior magnetic field (better than 1 ppm) throughout the inner cylindrical volume 125. The direction of the interior magnetic field is parallel to the direction of magnetization, as indicated by arrow 130. The ratio B0/Br of such magnetic system cannot exceed 0.5.

Figure 4:
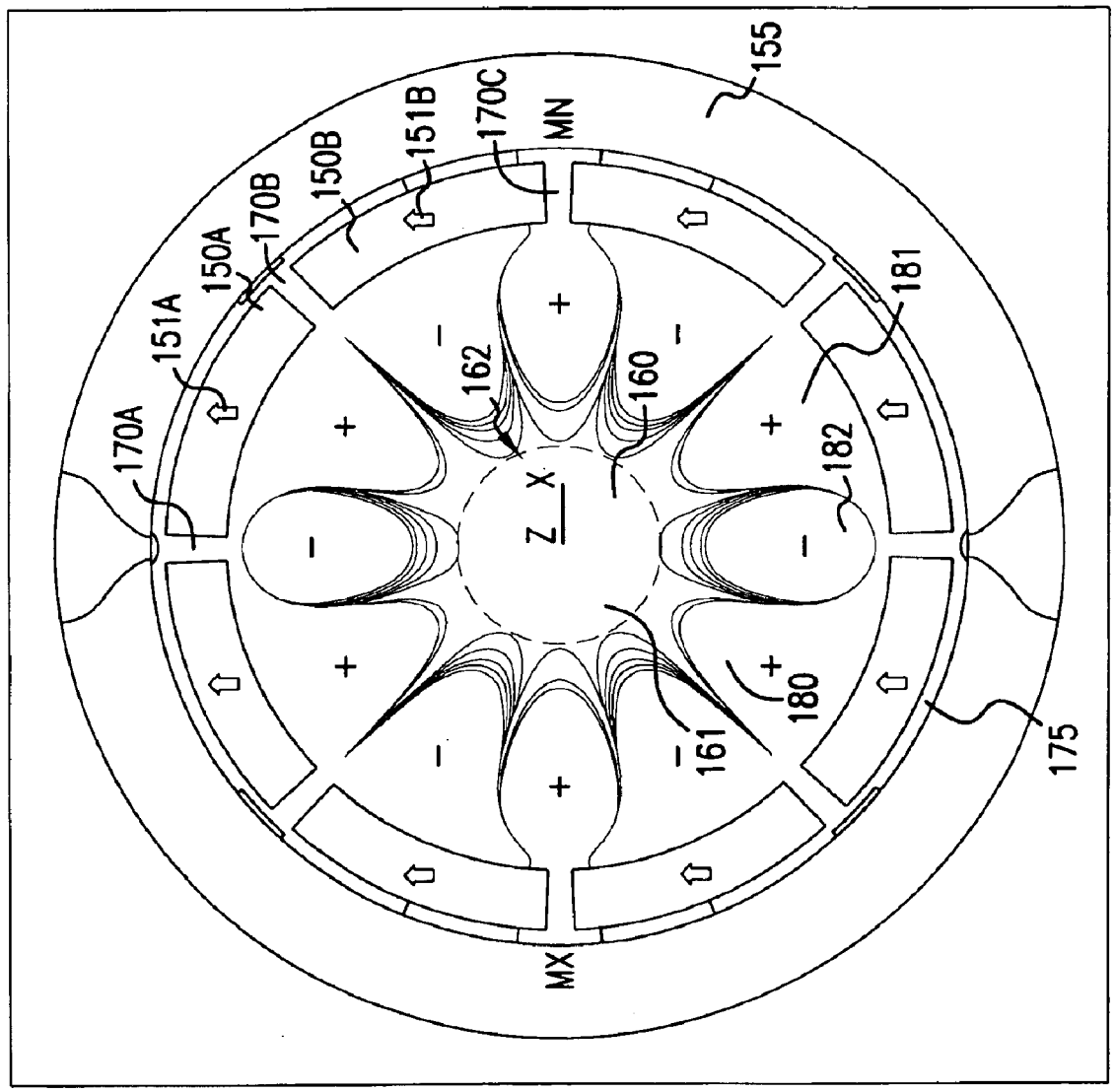
FIG. 4 is a simplified cross-sectional view of another embodiment of a magnet assembly used in accordance with the present invention.

The desired variation in the size of the homogeneous region in accordance with the present invention may be achieved by dividing of the magnetic cylinder 120 in FIG. 2 into separated segments 150, as shown in FIG. 4. The directions of magnetization 151 of each segment 150 are collinear. Preferably the total number of segments in 2(n+1), wherein n is an integer. The resulting interior magnetic field has two different magnetic regions differing by their magnetic field gradients: (1) a central region 160 with relatively homogeneous field 161 (approximately ±0.05%) and (2) a peripheral region 180 with significantly stronger magnetic field gradient (181, 182).

Figure 5:
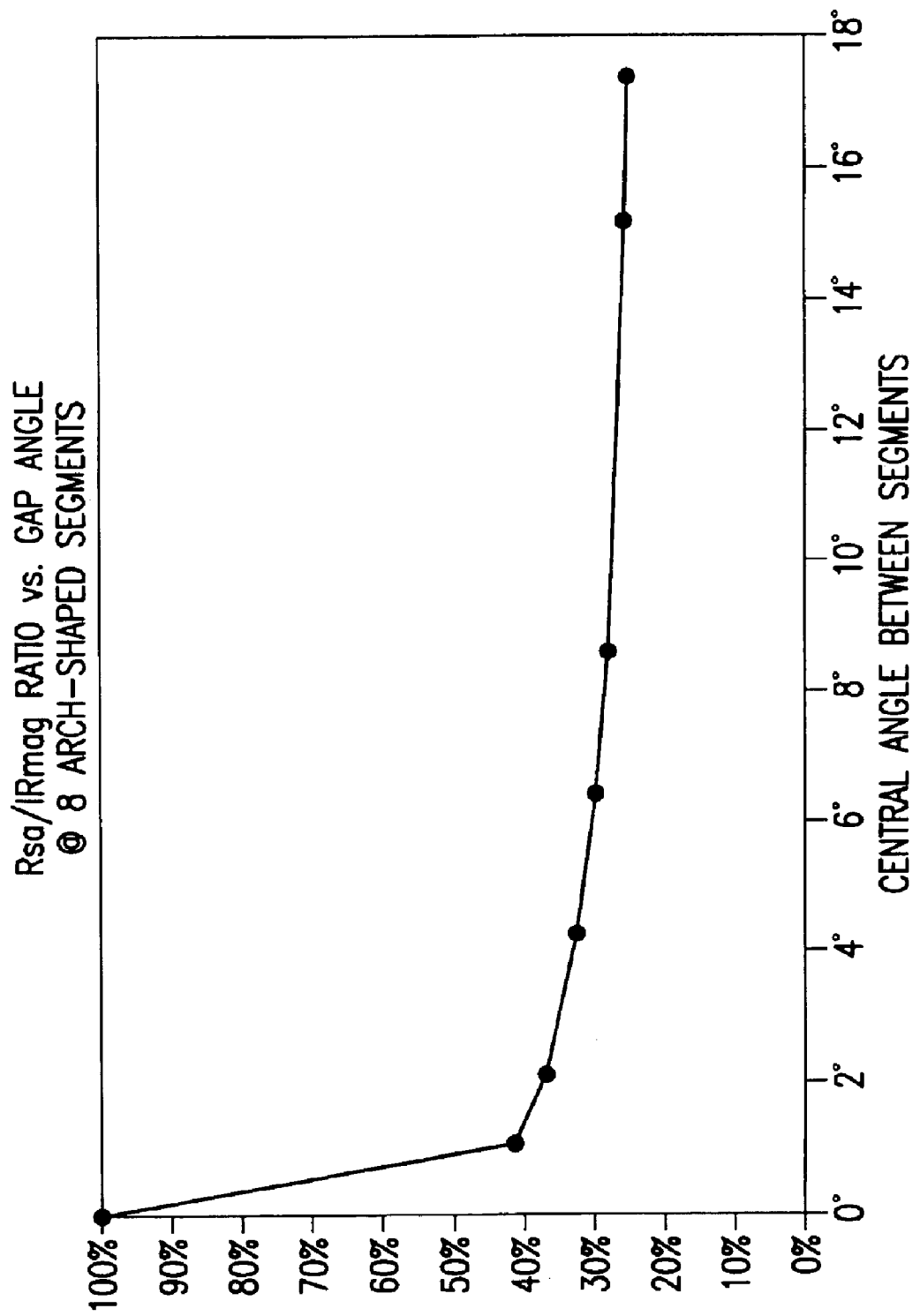
FIG. 5 shows the influence of the dimensions of non-magnetic gaps between the magnetic segments of an assembly, as used in accordance with the present invention, on the radius of the central homogeneous field region, for 8 arch-shaped segments.

The radius 162 of the central region 160 and the field strength 161 inside the region can be adjusted in accordance with the present invention by changing geometrical and/or magnetic parameters of the elements of the structure. FIG. 5 shows the influence of dimensions of non-magnetic gaps 170 between the magnetic segments 150 on the radius 162 of the central region 160. The calculations were done for the following fixed parameters of the structure:

number of magnetic segments—8;

inner (IR) and outer (OR) radii of segments—1.0585"IR/ 1.25"OR;

thickness of cylindrical non-magnetic gap 175 between the outer diameter of the segments 150 and the inner diameter of the magnetic yoke 155—0.05"). In FIG. 5 the gaps 170 are represented in terms of angular displacement between the magnetic segments 150. As can be seen from FIG. 5, the value of the gaps 170 has influence on the radius 162 of the homogeneous region 160. The functional relationship illustrated in FIG. 5 enables designers to determine the radius of the homogeneous magnetic field region from the angular displacement between the magnets.

Figure 6:
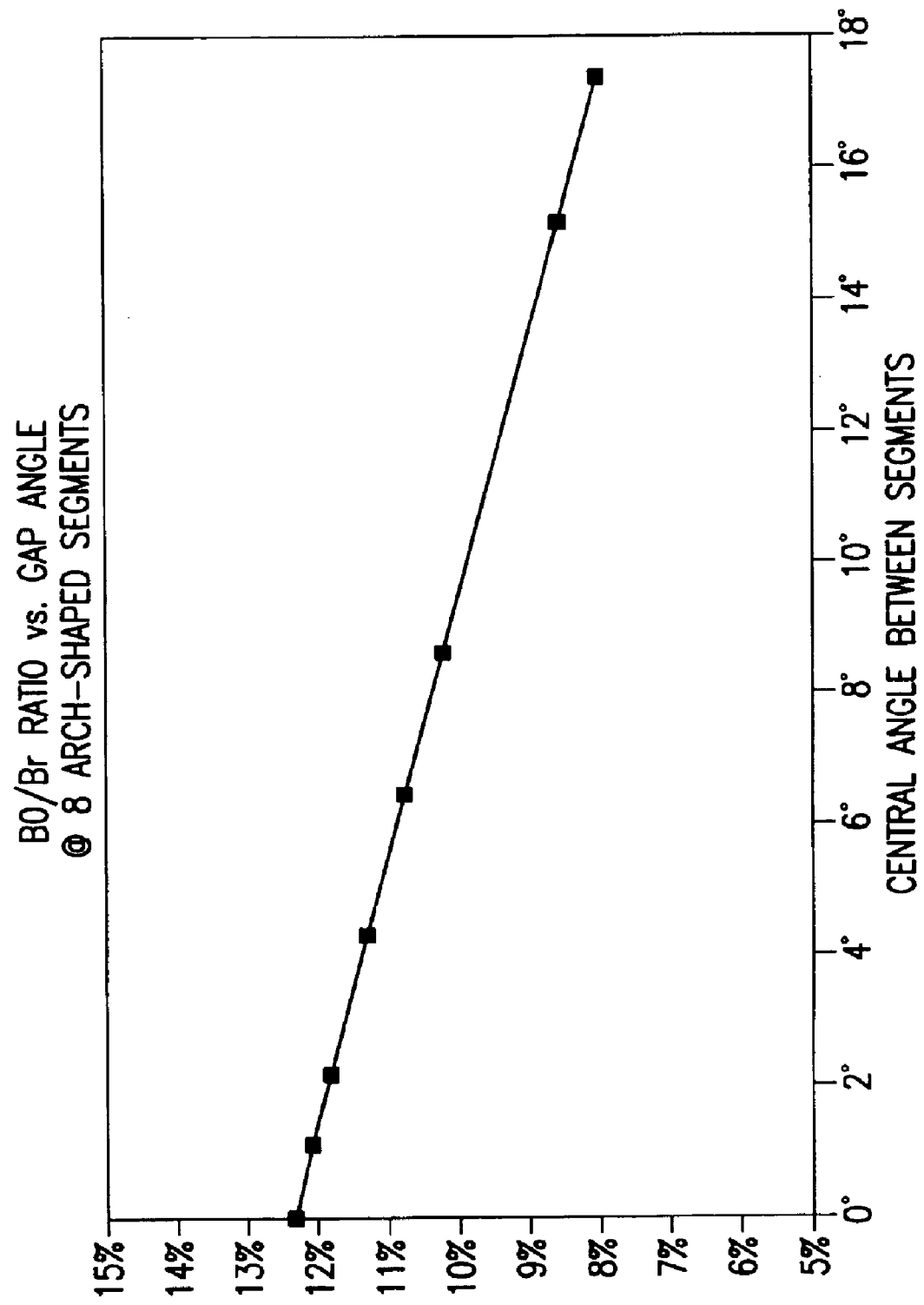
FIG. 6 shows the plot of the functional dependence of the B0/Br ratio from the central angle between segments, for 8 arch-shaped segments.

It should also be apparent that these changes in the dimensions of the non-magnetic gaps 170 result in variations of the field strength 161 of the central region 160. As shown in FIG. 6, increasing of the non-magnetic gap between segments leads to decreasing of the magnetic field strength 161 in the sensitive region 160. Clearly, therefore, for a given magnet configuration one can compute both the strength of the field within the homogeneous magnetic region, as well as the size of this region.

Figure 7:
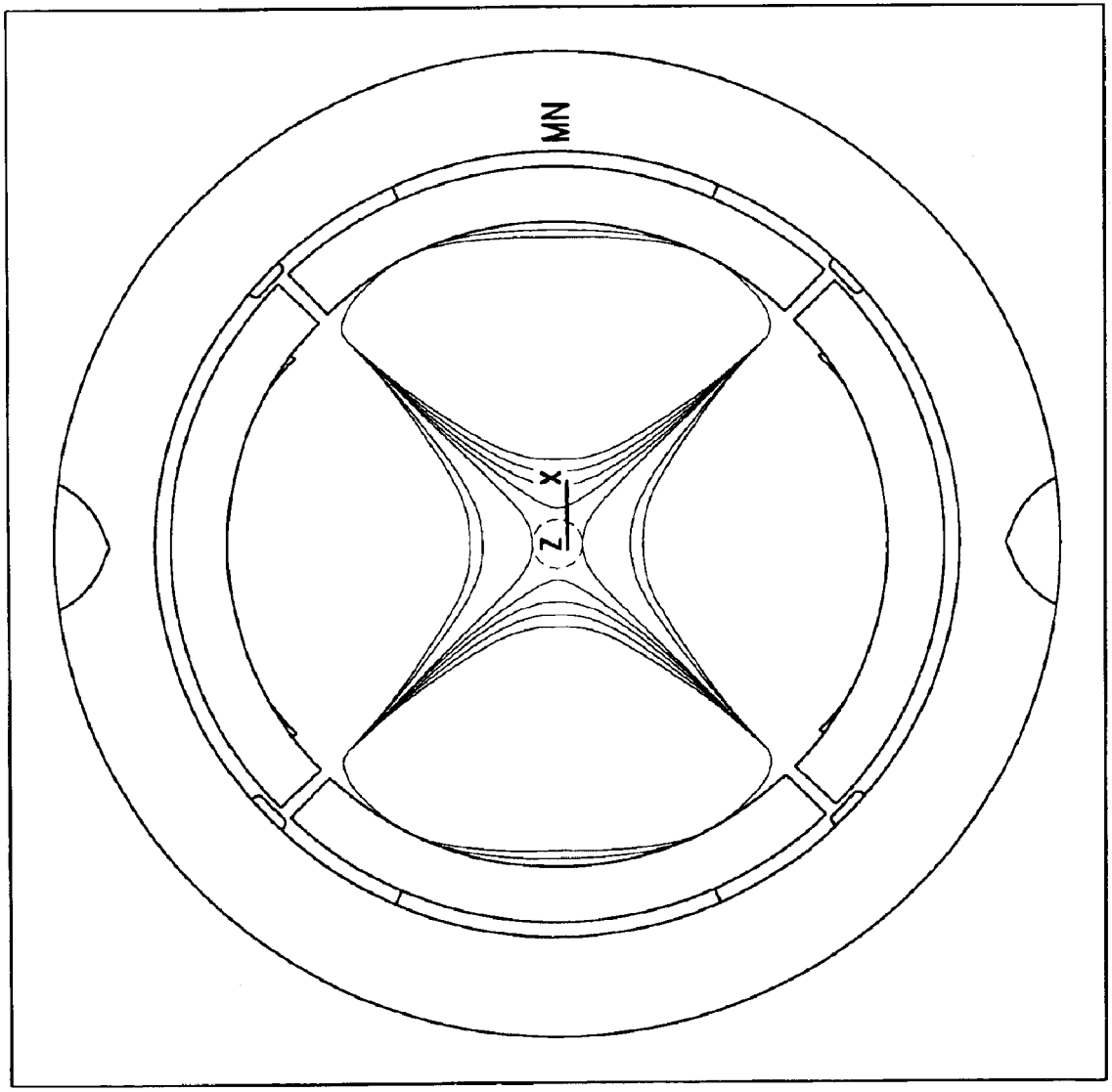
FIGS. 7 and 8 show the influence of the number of segments used in accordance with the present invention on the dimensions and shape of the interior homogeneous region.
Figure 8:
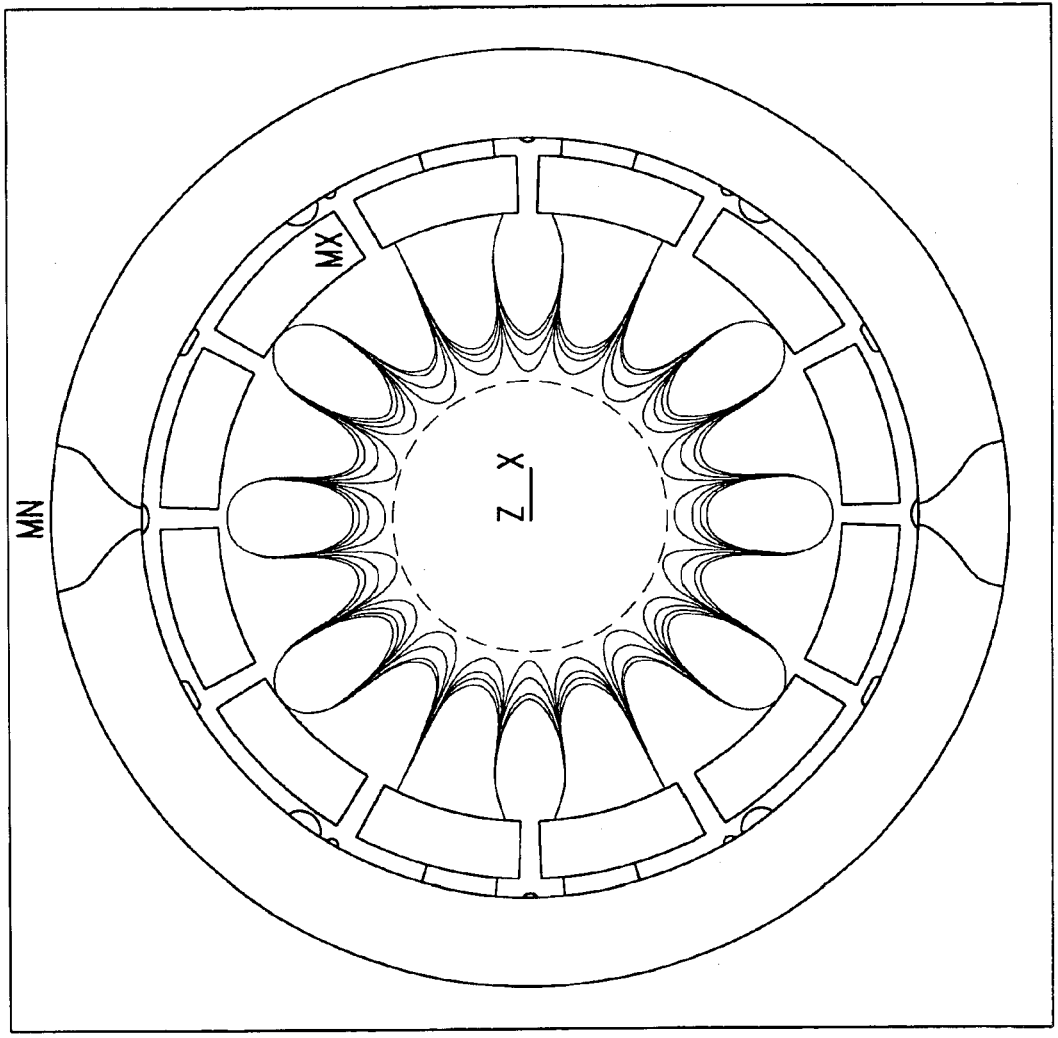

Additional measures for adjusting of the sensitive region dimensions and field strength can be used in accordance with the present invention, and include: changes of the dimensions of the non-magnetic gap 175; changes in the number of segments 170, changes in the dimensions and magnetic properties of the segments 170 as well as the yoke 155. FIGS. 7 and 8 show the influence of the number of segments on dimensions and shape of the interior homogeneous region. Programs that compute the shape, strength and additional parameters of a magnetic field generated by a particular magnet configuration are known in the art and need not be described in detail. For example, finite element design program, such as Quickfield can be used. Using this and other commercially available programs, one can also develop a procedure to compute shimming that may be used to vary the parameters of the generated field for any particular magnet configuration. Such computation can make use of three dimensional finite element analysis or a three-dimensional calculation of the field produced by the magnet assembly, using a surface charge model appropriate for rare earth permanent magnetic materials. For example, one can use the ANSYS program packages from ANSYS Inc., Southpointe, Pa.

In accordance with a preferred embodiment, the magnet assembly uses permanent magnets to provide the desired magnetic fields. Examples of materials used in the permanent magnets are samarium-cobalt alloys, neodymium-iron-boron alloys, and other are-earth alloys, as may be obtained through producers such as Electron Energy Corporation of Lancaster, Pa. Since for most NMR applications the stability of the homogeneous magnetic field is especially significant, the preferable magnetic material is SmCo. This material has linear demagnetization curve in the second quadrant and, more importantly, has the smallest temperature coefficient of Br. (−0.03 to −0.001%/K) among alternative magnetic materials suitable for use in the Halbach structures (−0.12 . . . − 0.008%/K for NdFeB, and −0.2 . . . −0.17%/K for hard ferrite). Common range for Br for SmCo is 06 . . . 1.2 T. Notably, for those NMR sensors which require magnetic field intensities of the sensitive region weaker than 0.1 T, the usage of SmCo material in a prior art "magic" cylinder necessarily leads to making very thin magnetic sectors when the radial thickness of the sector is considerably less than its other dimensions. In such case, it is difficult to provide a high uniformity of magnetic properties of the sector material. As a result, the obtaining of the desired field uniformity is problematical. In accordance with the present invention, this problem can be eliminated completely, because the strength of the field in the homogeneous inner region can be determined by the gaps between magnets, and thus can be adjusted easily.

In addition to rare-earth materials, such as SmCo, in accordance with the present invention it is contemplated, however, that other magnetic elements, such as electromagnets may be used alternatively or additionally as elements of the magnetic assembly. In one embodiment, the one or more electromagnets in the assembly can be switched on or off, or can be provided variable amounts of current, to selectively shape the inner and outer regions of the magnetic field. It will be appreciated that in such embodiment a control circuit coupled to the electromagnet can be used to control the current provided to the electromagnet, and thereby to control the spatial profile of the first and second magnetic fields. Details of such a control circuit are beyond the scope of this invention and will not be considered in further detail.

In accordance with another aspect of the invention, additional tuning of the size and strength of the magnetic fields can be accomplished using ferromagnetic, diamagnetic, or paramagnetic shims mounted in the gaps between neighboring magnets. In operation, these shims can be moved around in the gaps to provide control over the shape of the magnetic fields and in particular the size of the inner portion.

It will be appreciated by those skilled in the art that the magnet assemblies can be used to carry out, for example, nuclear magnetic resonance (NMR) analysis on a core bounded by inner region 50. According to one method of operation, the inner region is a cylinder 50 is energized with RF energy and NMR signals are detected from the homogeneous magnetic field of inner cylinder 50. NMR signals from annulus 56 may then be discarded because the magnetic field of the annulus is substantially different from that of inner cylinder 50. Alternatively or in addition, the detectors used to receive NMR signals may be designed so that they are sensitive only to signals received from materials exposed to the specific field intensity found in the inner cylinder 50. Thus, NMR analysis may be conveniently confined to only those materials located within the inner cylindrical region of a defined volume. It will be recognized that such an apparatus and method can also be used in the context of Magnetic Resonance Imaging (MRI). A magnet system in accordance with the present invention could also be interfaced to many standard NMR spectrometers. For example, one could use the MARAN-2 magnetic resonance analyzer fabricated by Resonance Systems, Oxford, UK.

Persons skilled in the art will appreciate that the present invention is not limited by the illustrations that have been particularly shown and described above. Rather, the scope of the present invention is limited only by the claims, which follow.

What is claimed is:

1. A magnet assembly for use in magnetic resonance measurements, comprising:
   four or more pairs of magnets arranged to surround a tubular volume of space and provide in at least a portion of the surrounded volume a substantially homogeneous magnetic field, the magnets of each pair being disposed diametrically opposite each other with respect to the surrounded volume with magnetization directions having substantially the same orientation, and adjacent magnets of the assembly being separated by gaps, thereby permitting magnetic flux between adjacent magnets to substantially extend into the surrounded volume, the placement and magnetic properties of the magnets being selected to produce:
   a. a first magnetic field, substantially homogeneous, within an inner portion of the surrounded volume; and
   b. a second magnetic field, substantially different from the first magnetic field, in the remainder of the surrounded volume.

2. The magnet assembly of claim 1, wherein gaps between adjacent magnets of the assembly comprise material of low magnetic permeability.

3. The magnet assembly of claim 1, further comprising:
   a support structure that holds the magnets in position, with each magnet held at a distance from adjacent magnets in the magnet assembly, thereby creating the gaps between adjacent magnets.

4. The magnet assembly of claim 1, wherein the gaps between adjacent magnets comprise air or vacuum.

5. The magnet assembly of claim 1, wherein the pairs of magnets include:
   a. a first pair of magnets oriented with their magnetizations pointing in a direction N, wherein N is substantially perpendicular to the axis;
   b. a second pair of magnets oriented with their magnetizations pointing in a direction substantially opposite to N;
   c. a third pair of magnets oriented with their magnetizations pointing in a direction between 1° and 179° away from N; and
   d. a fourth pair of magnets oriented with their magnetizations pointing in a direction between 181° and 359° from N.

6. The magnet assembly of claim 1, wherein the second magnetic field is generated by the extension into the surrounded volume of magnetic flux between adjacent magnets.

7. The magnet assembly of claim 1, wherein the second magnetic field is heterogeneous.

8. The magnet assembly of claim 1, wherein the inner portion of the surrounded volume has substantially cylindrical shape.

9. The magnet assembly of claim 1, wherein the magnets in the magnet assembly are characterized by dimensions, magnetic properties, and orientations selected to produce the second magnetic field substantially different from the homogeneous magnetic field.

10. The magnet assembly of claim 1, wherein at least one of the magnets in the magnet assembly comprises an electromagnet, the assembly further comprising: a control circuit coupled to the electromagnet and configured to control the current provided to the electromagnet, and thereby to control the spatial profile of the first and second magnetic fields.

11. The magnet assembly of claim 1, further comprising: at least one moveable tuning shim mounted within at least one of the gaps, wherein the tuning shim comprises ferromagnetic or diamagnetic or paramagnetic material, thereby permitting control over the spatial profile of the magnetic fields through motion of the tuning shim(s) within gaps between adjacent magnets.

12. The magnet assembly of claim 1, wherein the magnets of the magnet assembly are equally spaced.

13. The magnet assembly of claim 1, wherein each of the gaps between adjacent magnets subtend about 13°–17° angular spacing.

14. The magnet assembly of claim 1, wherein the number of magnets in the magnet assembly totals 2(n+1), where n is an integer greater than 1.

15. The magnet assembly of claim 1 further adapted to receive within the enclosed volume core material from drilled rock.

16. The magnet assembly of claim 16 further comprising equipment measuring magnetic resonance signals from the core material disposed within the surrounded volume of space.

17. A magnet assembly comprising: six or more pairs of magnets and, the magnets of each pair disposed opposite each other around an axis such that a region of space is surrounded by the magnets with the axis passing through the surrounded region; wherein the pairs of magnets include:

a. a first pair of magnets oriented with their magnetizations pointing in a direction N, wherein N is substantially perpendicular to the axis;

b. a second pair of magnets oriented with their magnetizations pointing in a direction substantially perpendicular to the axis and substantially opposite to N;

c. a third pair of magnets oriented with their magnetizations pointing in a direction substantially perpendicular to the axis and between about 1° and 90° from N;

d. a fourth pair of magnets oriented with their magnetizations pointing in a direction substantially perpendicular to the axis and between about 90° and 179° from N;

e. a fifth pair of magnets oriented with their magnetizations pointing in a direction substantially perpendicular to the axis and between about 181° and 270° from N; and f. a sixth pair of magnets oriented with their magnetizations pointing in a direction substantially perpendicular to the axis and between about 270° and 359° from N;

g. wherein adjacent magnets are separated by gaps, thereby permitting magnetic flux between adjacent magnets to substantially extend into the surrounded region and the positions and magnetic properties of the magnets being selected to produce: (1) a first magnetic field, substantially homogeneous, within a first subregion of the surrounded region, and (2) a second magnetic field, substantially different from the first magnetic field, within a second subregion of the surrounded region, wherein the second subregion is located around the first region.

18. The magnet assembly of claim 17, wherein the gaps comprise material of low magnetic permeability.

19. The magnet assembly of claim 17, further comprising: a support structure that holds the magnets in position, with each magnet held at a distance from adjacent magnets in the magnet assembly, thereby permitting magnetic flux between adjacent magnets to substantially extend into the surrounded region.

20. The magnet assembly of claim 18, wherein the second magnetic field is heterogeneous.

21. The magnet assembly of claim 18, wherein the first subregion has substantially cylindrical shape.

22. The magnet assembly of claim 18, wherein the magnets in the magnet assembly are characterized by dimensions, magnetic properties, and orientations selected to produce the second magnetic field substantially different from the first magnetic field.

23. A magnet assembly comprising:

a. four or more magnets disposed around a tubular volume of space, all magnets being disposed so that their magnetization directions have substantially the same orientation, and adjacent magnets of the assembly being separated by gaps, thereby permitting magnetic flux between adjacent magnets to substantially extend into the surrounded volume; and b. a ring made of high permeability material, the ring disposed around the magnets to provide a path for magnetic field lines of the magnets.

24. The magnet assembly of claim 23, wherein the ring is made of ferromagnetic material.

25. The magnet assembly of claim 23, wherein the ring comprises two or more elements, with gaps between the two or more elements.

26. The magnet assembly of claim 23, wherein the ring is a continuous cylindrical element.

27. The magnet assembly of claim 23, wherein gaps between adjacent magnets of the assembly comprise material of low magnetic permeability.

28. The magnet assembly of claim 23, further comprising: a support structure that holds the magnets in position, with each magnet held at a distance from adjacent magnets in the magnet assembly, thereby creating the gaps between adjacent magnets.

29. The magnet assembly of claim 23, wherein the gaps between adjacent magnets comprise air or vacuum.

30. The magnet assembly of claim 23, the placement and magnetic properties of the magnets and the gaps therebetween being selected to produce:

a. a first magnetic field, substantially homogeneous, within an inner portion of the surrounded volume, and b. a second magnetic field, substantially different from the first magnetic field, in the remainder of the surrounded volume.

31. The magnet assembly of claim 30, wherein the second magnetic field is heterogeneous.

32. The magnet assembly of claim 23, wherein the inner portion of the surrounded volume has substantially cylindrical shape.

33. The magnet assembly of claim 23, wherein at least one of the magnets in the magnet assembly comprises an electromagnet, and the assembly further comprises a control circuit coupled to the electromagnet and configured to control the current provided to the electromagnet, and thereby to control the spatial profile of the first and second magnetic fields.

34. The magnet assembly of claim 23, further comprising: at least one moveable tuning shim mounted within at least one of the gaps, wherein the tuning shim comprises ferromagnetic or diamagnetic or paramagnetic material, thereby permitting control over the spatial profile of the magnetic fields through motion of the tuning shim(s) within gaps between adjacent magnets.

35. The magnet assembly of claim 23, wherein the number of magnets in the magnet assembly totals 2(n+1), where n is an integer greater than 1.

36. The magnet assembly of claim 23 further adapted to receive within the enclosed volume core material from drilled rock.

37. The magnet assembly of claim 36 further comprising equipment measuring magnetic resonance signals from the core material disposed within the surrounded volume of space.

* * * * *